US012787670B2

(12) United States Patent
Lee et al.

(10) Patent No.: US 12,787,670 B2
(45) Date of Patent: Nov. 3, 2026

(54) METHOD FOR MANUFACTURING SEMICONDUCTOR DIE

(71) Applicant: SK keyfoundry Inc., Cheongju-si (KR)

(72) Inventors: Dal Jin Lee, Cheongju-si (KR); Yang Beom Kang, Cheongju-si (KR); Kang Sup Shin, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 417 days.

(21) Appl. No.: 18/524,809

(22) Filed: Nov. 30, 2023

(65) Prior Publication Data

US 2024/0355631 A1 Oct. 24, 2024

(30) Foreign Application Priority Data

Apr. 20, 2023 (KR) ........................ 10-2023-0052063

(51) Int. Cl.
*H10P 50/24* (2026.01)
*H10P 50/26* (2026.01)
*H10P 50/28* (2026.01)

(52) U.S. Cl.
CPC .......... *H10P 50/242* (2026.01); *H10P 50/266* (2026.01); *H10P 50/283* (2026.01)

(58) Field of Classification Search
CPC .... H10P 50/242; H10P 50/266; H10P 50/283; B81C 2201/014; B81C 1/00087; H10W 20/023; H10W 20/20
See application file for complete search history.

(56) References Cited

U.S. PATENT DOCUMENTS

| | | | | |
|---|---|---|---|---|
| 9,540,234 | B2 | 1/2017 | Lee et al. | |
| 2013/0313562 | A1 * | 11/2013 | Epler ..................... | H10H 20/85 438/22 |
| 2020/0209476 | A1 * | 7/2020 | Mattis .................... | G02B 6/136 |

* cited by examiner

*Primary Examiner* — Samuel A Gebremariam
(74) *Attorney, Agent, or Firm* — NSIP Law

(57) ABSTRACT

A method for manufacturing a semiconductor die includes forming a front side of a semiconductor wafer; etching a surface of the semiconductor wafer to a predetermined depth to form a first aperture in the front side of the semiconductor wafer; forming a protective layer on the front side of the semiconductor wafer and performing a first turning-over of the semiconductor wafer to a back side of the semiconductor wafer; exposing a bottom of the first aperture to form a second aperture in the back side of the semiconductor wafer; and performing a second turning-over of the semiconductor wafer to the front side of the semiconductor wafer and removing the protective layer.

13 Claims, 14 Drawing Sheets

METHOD FOR MANUFACTURING SEMICONDUCTOR DIE

CROSS-REFERENCE TO RELATED APPLICATION

This application claims the benefit under 35 USC 119(a) of Korean Patent Application No. 10-2023-0052063, filed on Apr. 20, 2023, in the Korean Intellectual Property Office, the entire disclosure of which is incorporated herein by reference for all purposes.

BACKGROUND

1. Field

The following description relates to a method for manufacturing a semiconductor die.

2. Description of the Background

In semiconductor devices, a Micro Electro Mechanical System (MEMS) or a sensor is a device including a drive part including a fine mechanical structure or a fine optical component, and a control part including an electrical circuit that transmits a control signal or a sensing signal. These structures constituting the MEMS or sensor are manufactured based on semiconductor manufacturing technology that microprocesses semiconductor wafers.

As a semiconductor manufacturing technology, a manufacturing process of penetrating a semiconductor wafer is applied for the high functionality of MEMS or sensors. By applying the through structure of the semiconductor wafer to the MEMS or sensor manufacturing process, advantages such as avoiding circuit damage, high-density integration, miniaturization, and increased speed may be expected.

The through structure of the semiconductor wafer refers to a structure where holes connect the front and back sides of the semiconductor wafer, and there are various methods to achieve this through structure. For example, one method involves depositing a protective layer on one side and using etching equipment on the other to penetrate the semiconductor wafer's front and back sides simultaneously. Another method involves forming a primary hole in the front side of the wafer where components or wirings are included and forming a secondary hole in the back side of the wafer to connect the two holes. Depending on the connection method, various cases are possible.

Typically, it is not easy and time-consuming to penetrate at once due to a semiconductor wafer and an oxide or oxide/metal wire structure present on the semiconductor wafer.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one or more general aspects, a method for manufacturing a semiconductor die includes forming a front side of a semiconductor wafer; etching a surface of the semiconductor wafer to a predetermined depth to form a first aperture in the front side of the semiconductor wafer; forming a protective layer on the front side of the semiconductor wafer and performing a first turning-over of the semiconductor wafer to a back side of the semiconductor wafer; exposing a bottom of the first aperture to form a second aperture in the back side of the semiconductor wafer; and performing a second turning-over of the semiconductor wafer to the front side of the semiconductor wafer and removing the protective layer.

In the formation of the second aperture, the second aperture may become connected to the first aperture once the protective layer is removed.

The formation of the front side of the semiconductor wafer may includes forming a first oxide layer; forming a nitride layer on the first oxide layer; and forming, on the nitride layer, at least one second oxide layer in which a metal wire is formed.

The first oxide layer may serve as an etching stop layer when forming the second aperture.

The nitride layer may be formed thinner than the first oxide layer.

The protective layer may be formed of photoresist (PR) or polyimide, a carbon-based material.

A width of the first aperture may be greater than a width of the second aperture.

In another one or more general aspect, a method for manufacturing a semiconductor die includes forming a first oxide layer in a semiconductor wafer; forming a nitride layer on the first oxide layer; forming, on the nitride layer, at least one second oxide layer in which a metal wire is formed; etching an upmost second oxide layer of the at least one second oxide layer to a predetermined depth to form a first aperture having a first width on a front side of the semiconductor wafer; forming a protective layer on the first aperture; etching a back side of the semiconductor wafer to form a second aperture, having a second width, connected to the first aperture; and removing the protective layer.

The method may further include turning over the semiconductor wafer when forming the first aperture and the second aperture.

The second width of the second aperture may be greater than the first width of the first aperture.

The nitride layer may be thinner than the first oxide layer.

In another one or more general aspect, a method for manufacturing a semiconductor die, includes forming a first oxide layer, a silicon nitride layer, and a second oxide layer in a semiconductor wafer, wherein the second oxide layer comprises a contact plug and a metal wire; etching the first oxide layer and the second oxide layer to form a first aperture having a first width; forming a protective layer on the first aperture; etching another side of the semiconductor wafer to form a second aperture, having a second width, connected to the first aperture; and removing the protective layer.

The first oxide layer may serve as an etching stop layer when forming the second aperture.

The silicon nitride layer may serve as an etching stop layer when forming the first aperture.

Other features and aspects will be apparent from the following detailed description, the drawings, and the claims.

Figure 1A:
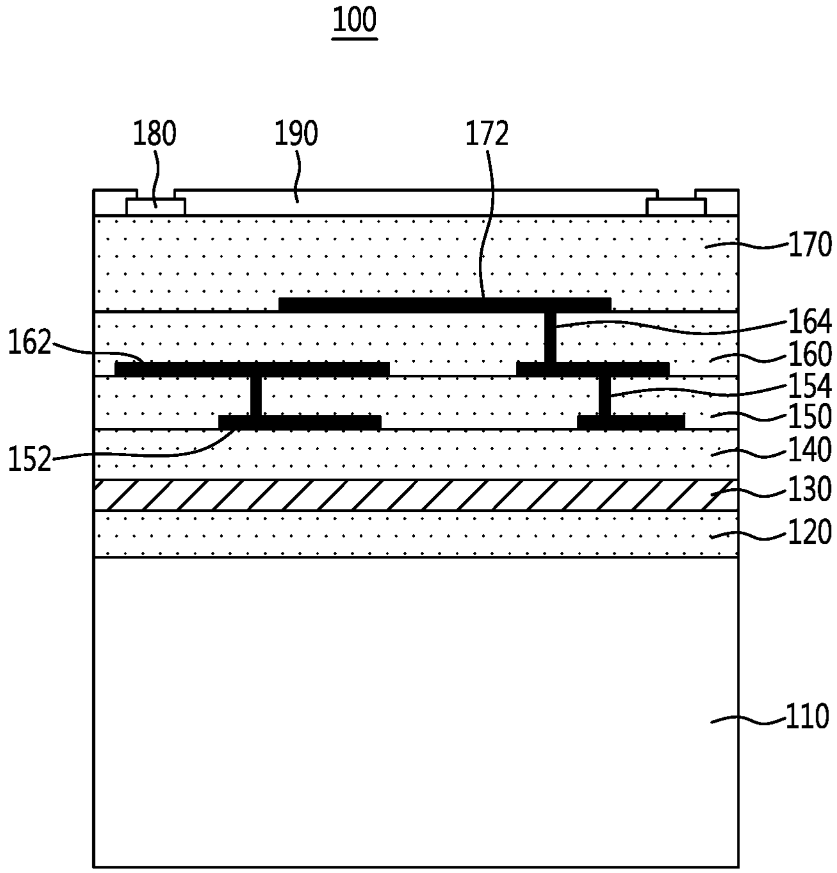
FIGS. 1A to 1G illustrate process diagrams showing a method for manufacturing a semiconductor die with a through structure according to a first example of the present disclosure.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure relates to a method for manufacturing a semiconductor die to form a through structure in a semiconductor wafer when designing a device that requires a through structure, such as a Micro Electro Mechanical System (MEMS) or sensor.

FIGS. 1A to 1G illustrate process diagrams showing a method for manufacturing a semiconductor die with a through structure according to a first example of the present disclosure. Specifically, FIGS. 1A to 1G illustrate sectional views of a method for penetrating a silicon wafer for designing devices with through structures. The manufacturing method will be described by referring to the sectional views. Although not shown in the drawings, a silicon wafer may be mounted on, for example, a wafer chuck for fastening wafers used to manufacture semiconductor devices.

Referring to FIG. 1A, a semiconductor device 100, according to an example of the present disclosure, includes a semiconductor wafer 110. The semiconductor wafer 110 may include a semiconductor material such as silicon (Si), but other semiconductor materials may also be used.

FIG. 1A shows a process of forming a front side of a silicon wafer 110. To form the front side of the silicon wafer 110, a first silicon oxide ($SiO_2$) layer 120 is formed in the silicon wafer 110. In this case, the first silicon oxide layer 120 is formed by depositing an oxide-based dielectric material with good selectivity under silicon etching conditions, allowing it to provide an etching stop function and enabling its formation with a relatively thin thickness due to the high selectivity. According to examples of the present disclosure, the first silicon oxide layer 120 is deposited with a first thickness, which may be about several thousand angstroms Å.

A silicon nitride (SiN) layer 130 with a second thickness is deposited on the first silicon oxide layer 120. The second thickness of the silicon nitride layer 130 may be less than the first thickness of the first silicon oxide layer 120.

A second silicon oxide ($SiO_2$) layer 140, an insulating layer, is then deposited on the silicon nitride layer 130. The thickness of the second silicon oxide layer 140 may be formed to a predetermined thickness. On top of the silicon nitride layer 130, at least one silicon oxide layer may be formed, which may be designed differently depending on the structure, specifications, etc. of the semiconductor device to be manufactured.

According to examples of the present disclosure, the first silicon oxide layer 120, the second silicon oxide layer 140, a third silicon oxide layer 150, a fourth silicon oxide layer 160, and a fifth silicon oxide layer 170 are sequentially stacked in order, and the silicon nitride layer 130 is located between the first silicon oxide layer 120 and the second silicon oxide layer 140.

A metal wire is formed in a zigzag shape in the second silicon oxide layer 140 and the fifth silicon oxide layer 170. For example, a first metal wire 152 may be formed in the third silicon oxide layer 150; a second metal wire 162 may be formed in the fourth silicon oxide layer 160; and a third metal wire 172 may be formed in the fifth silicon oxide layer 170.

At least one contact plug 154, 164 is included for the electrical connection of the metal wires 152, 162, 172. Specifically, the first contact plug 154 for connecting the first metal wire 152 and the second metal wire 162 and the second contact plug 164 for connecting the second metal wire 162 and the third metal wire 172 may be included. The first and second contact plugs 162, 172 are made of metal materials having superior electrical conductivity for electrically connecting the metal wires 152, 162, 172. As the metal materials, aluminum, tungsten, copper metal, etc., may be used. In the present disclosure, the first metal wire, the second metal wire, the third metal wire, and the first contact plug and the second contact plug are described, but it is not limited thereto and may be formed with more or fewer metal wires and contact plugs.

A pad 180 may be stacked on the fifth silicon oxide layer 170. On the pad 180, a passivation layer 190 may be formed to protect the top surface of the wafer, specifically to protect the first metal wire 152, the second metal wire 162 and the third metal wire 172 from a moisture or water. A portion of the pad may be formed to be exposed in the passivation layer 190 to allow electrical contact with the pad 180.

In this way, the silicon oxide layers 120, 140, 150, 160, 170, the silicon nitride layer 130, the pad 180, and the passivation layer 190 are formed in this order on the silicon wafer 110 to complete the front side of the silicon wafer 110.

Figure 1B:
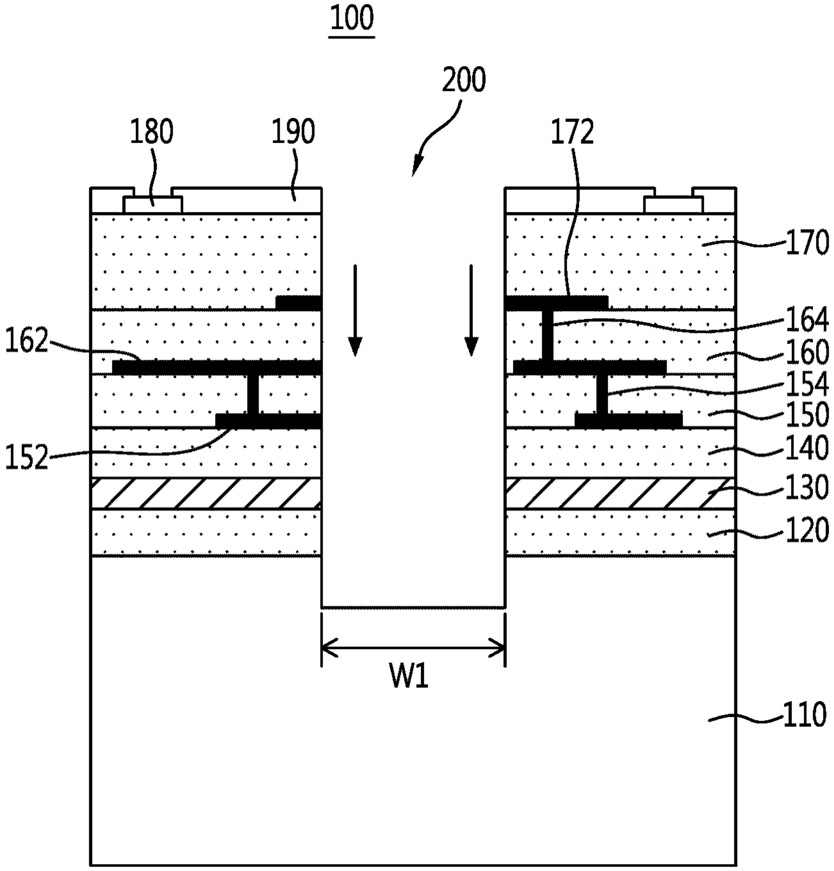

FIG. 1B shows that a first etching process is performed. The first etching process forms a hole 200, also referred to herein as aperture 200, in the front side of a silicon wafer to form a through structure. The first etching process is performed by a predetermined etching method. By the etching process, a fifth silicon oxide layer 170, a fourth silicon oxide layer 160, a third silicon oxide layer 150, a second silicon oxide layer 140, a silicon nitride layer 130, and a first silicon layer 120 are removed, and metal wires 152, 162, 172 formed in the silicon layers 150, 160, 170 are also partially removed. The first etching process etches from the surface of the silicon wafer 110 to a predetermined depth. The depth may be several hundred angstroms Å from the surface of the silicon wafer 110 to the bottom of the frontside hole 200. In other words, all structures on the silicon wafer 110 are removed, and the frontside hole 200 is formed at a depth of several hundred angstroms Å with respect to the silicon wafer 110. The width of the frontside hole 200 formed by the first etching process has a first width w1.

FIG. 1B shows the state where the silicon wafer 110 has been removed by the first etching process. The first etching process may be performed separately to etch the oxide and the metal because the etching reaction gases for oxide and metal are different. Therefore, the oxide is removed through an oxide etching process using the oxide etching equipment, while the metal is removed through a metal etching process using the metal etching equipment. Of course, it may not be desired to limit the first etching process to the process described above. Regardless of the kind of etching process, as long as the frontside hole 200 may be formed to a depth of several hundred angstroms Å in the silicon wafer 110, various etching methods may be used.

Once the first etching process is complete, the frontside hole 200 is formed in the center of the silicon wafer 110, as shown in FIG. 1B. Further, side surfaces of the metal wires 152, 162, 172 may be exposed after the first etching process.

Figure 1C:
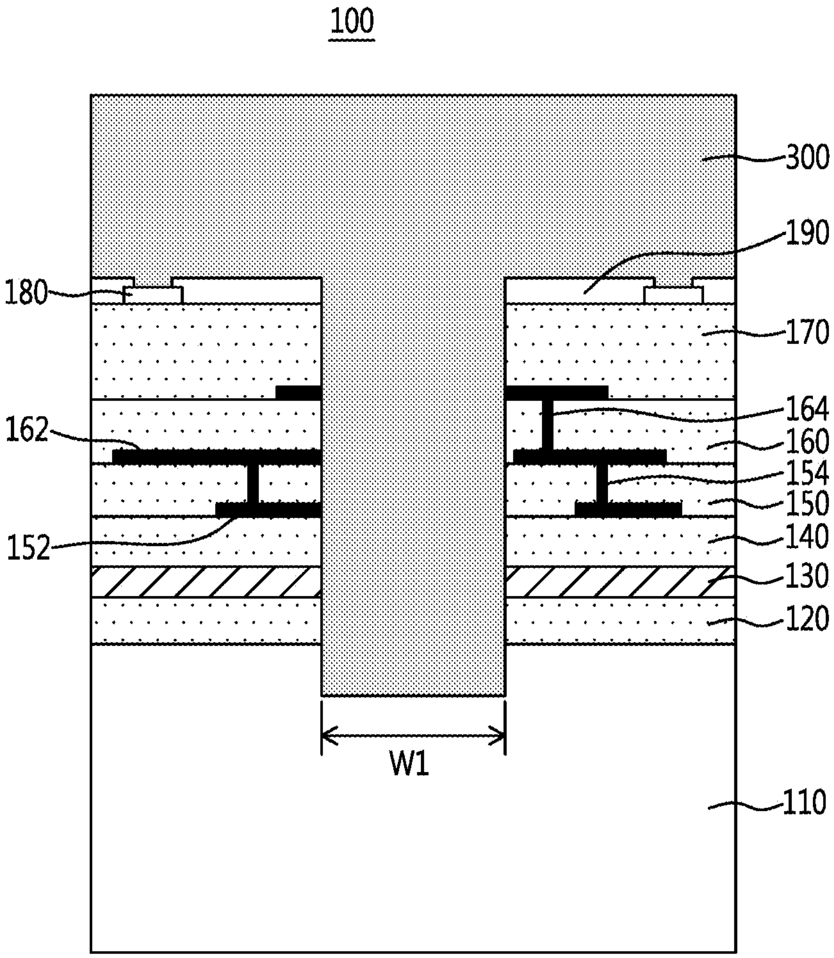

FIG. 1C shows a process for forming a protective layer 300 on the front side of a silicon wafer 110 to fill the frontside hole 200. The protective layer 300 covers the top surface of a passivation layer 190 and the sides and bottom of a frontside hole 200.

The reason for forming the protective layer 300 is to prevent damage, such as scratches, to circuits or elements formed in the front side of the silicon wafer 110. In other words, the silicon wafer must be turned over to form a backside hole in the back side of the silicon wafer 110 in a subsequent process. When the silicon wafer 110 is turned over in this manner, the front side of the silicon wafer 110 comes into contact with one side of the wafer chuck equipment for fastening the wafer, which may cause damage.

For the protective layer 300, a carbon-based material such as photoresist (PR) or polyimide may be used. That is because the protective layer 300 may be desired to protect the front side of the silicon wafer 110 and be removable in subsequent processes.

Figure 1D:
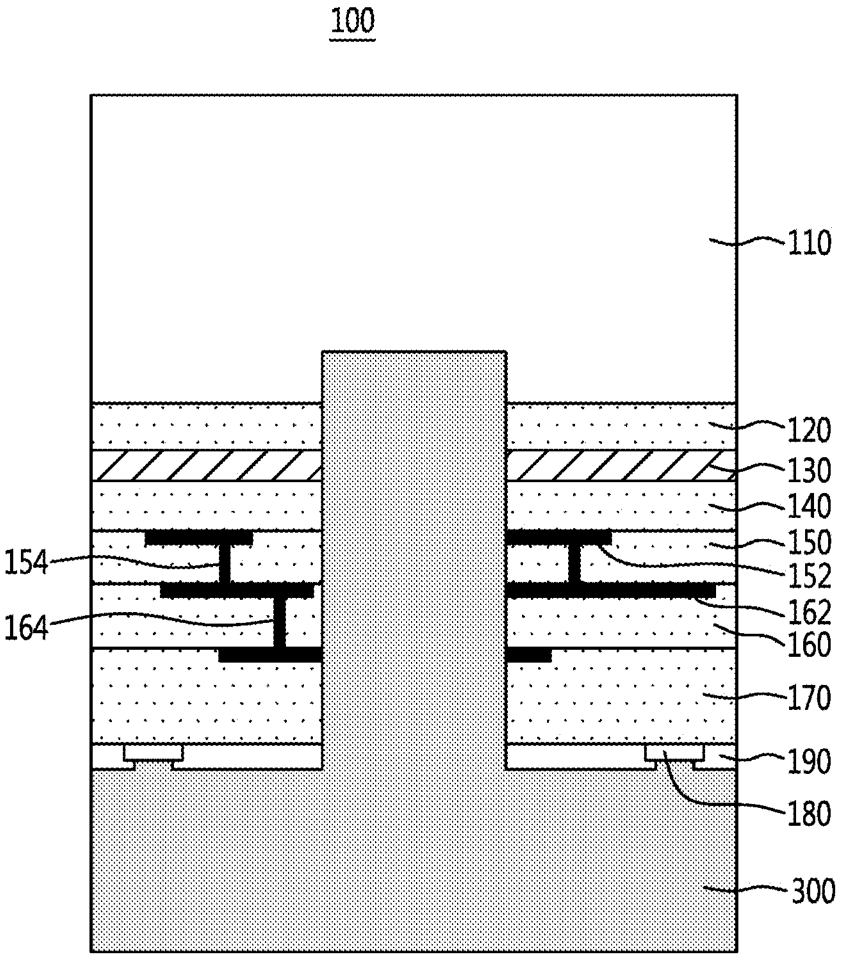

FIG. 1D shows the state where a silicon wafer 110 is turned over. When the silicon wafer 110 is turned over, referring to the drawing, the silicon wafer 110 from which a portion of the surface has been removed is located at the top. Below the silicon wafer 110 are a first silicon oxide layer 120, a silicon nitride layer 130, a second silicon oxide layer 140, and a third silicon oxide layer 150, in this order. A protective layer 300 is located at the bottom.

Figure 1E:
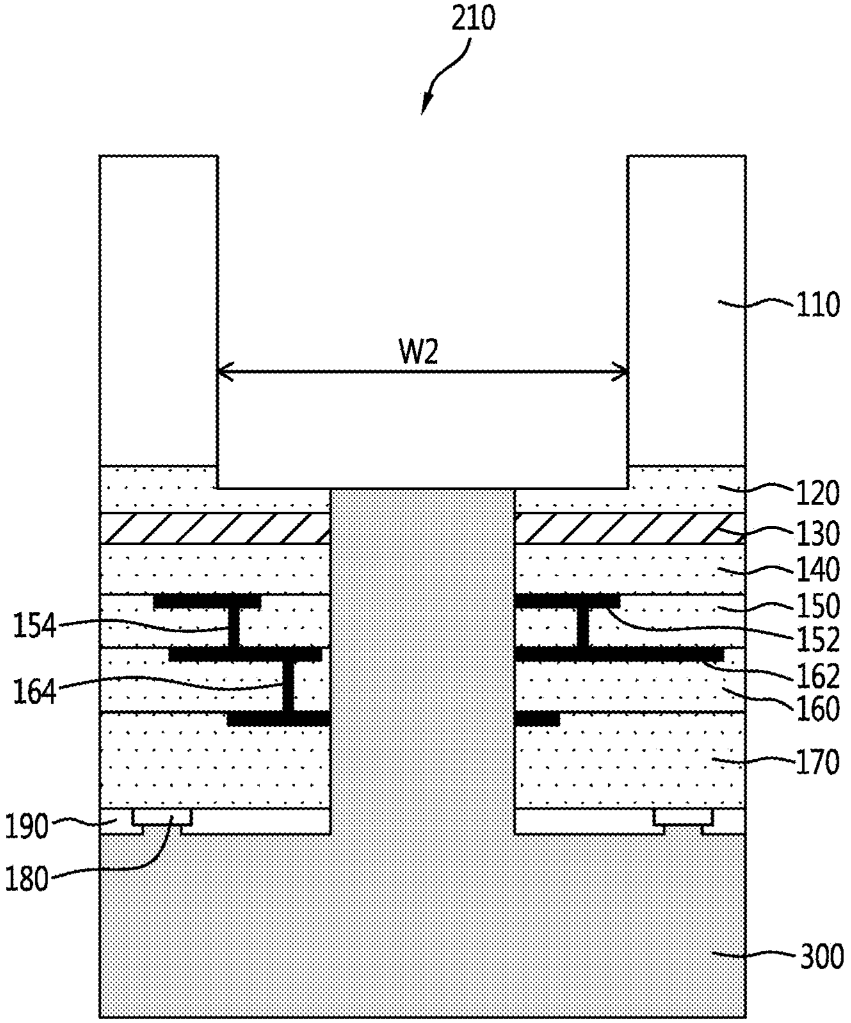

FIG. 1E shows a second etching process to from a backside hole 210, also referred to herein as backside aperture 210, in the back side of a silicon wafer 110.

The second etching process may form a backside hole 210 with a second width w2 greater than the first width w1. The backside hole 210 is formed by removing a portion of the silicon wafer 110 and a first silicon oxide layer 120. Specifically, in the second etching process, once the silicon wafer 110 is removed, the first silicon oxide layer 120, which has a high selectivity ratio, serves as an etching stop layer and is therefore no longer etched, and the process is performed until the backside hole 210 is connected to a frontside hole 200 by partially removing the first silicon oxide layer 120. When the backside hole 210 is formed, a silicon wafer 110' becomes a structure in which the silicon wafer 110' remains on both sides, referring to the drawing.

In the present disclosure, a Deep Reactive Ion Etching (DRIE), a deep silicon etching method, may be used for the second etching process.

Once the second etching process is complete, an ashing and cleaning process may be performed.

Figure 1F:
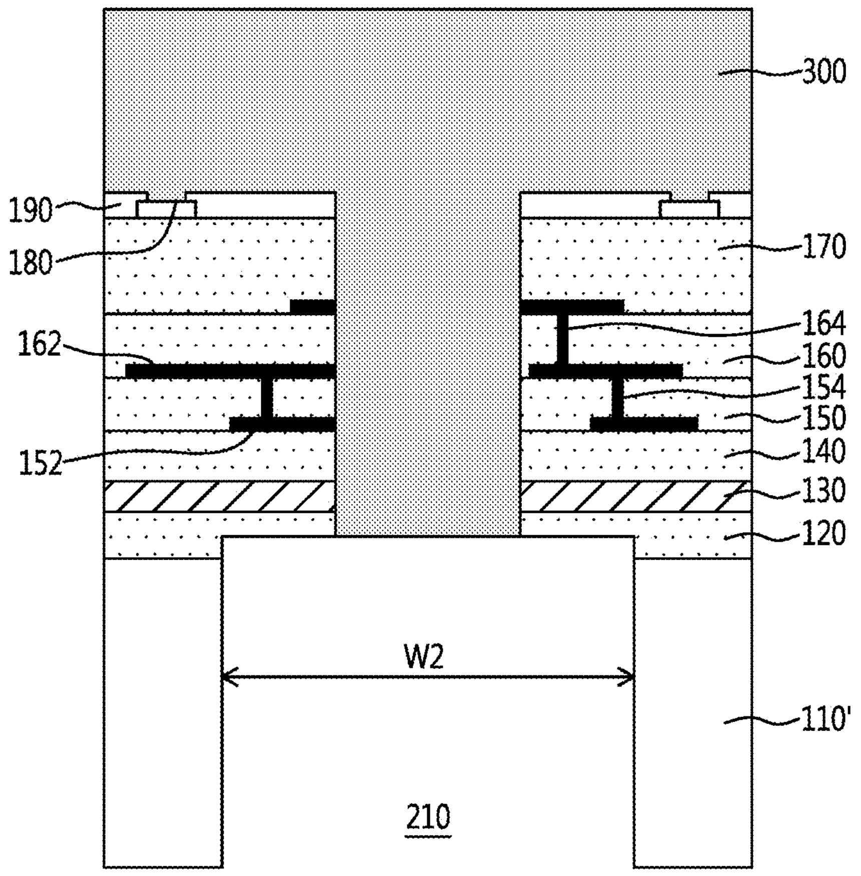

Upon completion of the second etching process illustrated in FIG. 1E, the silicon wafer 110 is turned over again, and this turned state is illustrated in FIG. 1F.

FIG. 1F shows the state where a backside hole 210 with a second width w2 is formed in a silicon wafer 110', and a protective layer 300 is formed in a frontside hole 200 with a first width w1. In that state, a protective layer removal process for removing the protective layer 300 is performed. The protective layer removal process removes the protective layer 300 made of photoresist (PR) or polyimide material, for example, by an $O_2$ ashing process. After the protective layer removal process, a cleaning process may be performed to remove foreign materials and other purposes.

Figure 1G:
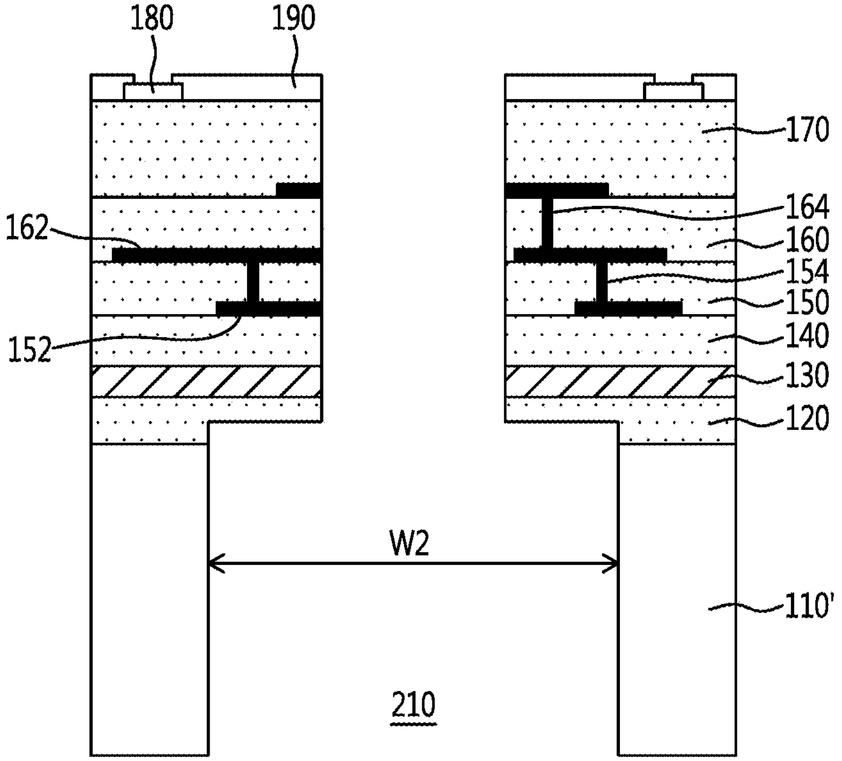

FIG. 1G shows a semiconductor device with a through structure in which the protective layer removal process has been performed. Once a protective layer 300 is removed, the semiconductor device obtains a structure where it is separated by through holes.

FIGS. 2A to 2G illustrate process diagrams showing a method for manufacturing a semiconductor die with a through structure according to a second example of the present disclosure. The difference from the first example described above lies in the difference in etching depth during the first etching process and the second etching process. The description will focus on configurations different from those of the first example.

Figure 2A:
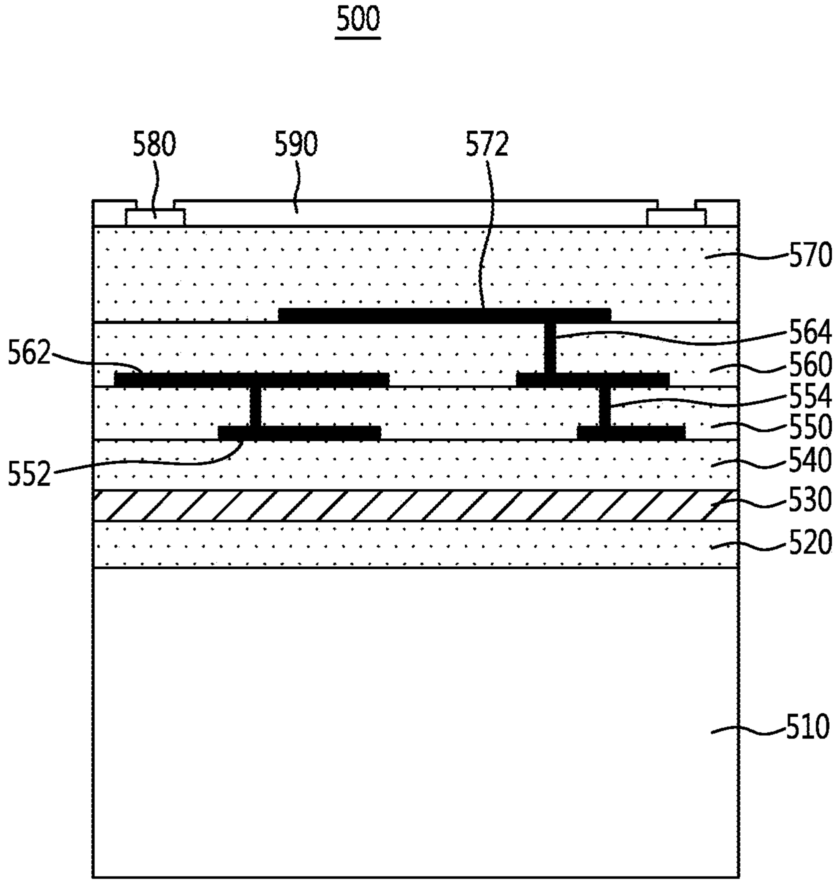
FIGS. 2A to 2G illustrate process diagrams showing a method for manufacturing a semiconductor die with a through structure according to a second example of the present disclosure.

FIG. 2A shows a process of forming a front side of a silicon wafer 510. To form the front side of the silicon wafer 510, a first silicon oxide layer 520, a silicon nitride layer 530, a second silicon oxide layer 540, a third silicon oxide layer 550, a fourth silicon oxide layer 560, a fifth silicon oxide layer 570, a pad 580, and a passivation 590 are deposited on the silicon wafer 510 in this order. In the third silicon oxide layer 550, the fourth silicon oxide layer 560, and the fifth silicon oxide layer 570, a first metal wire 552, a second metal wire 562, and a third metal wire 572 are formed, respectively, and contact plugs 554, 564 for contacting metal wires 552, 562, 572 are formed.

Figure 2B:
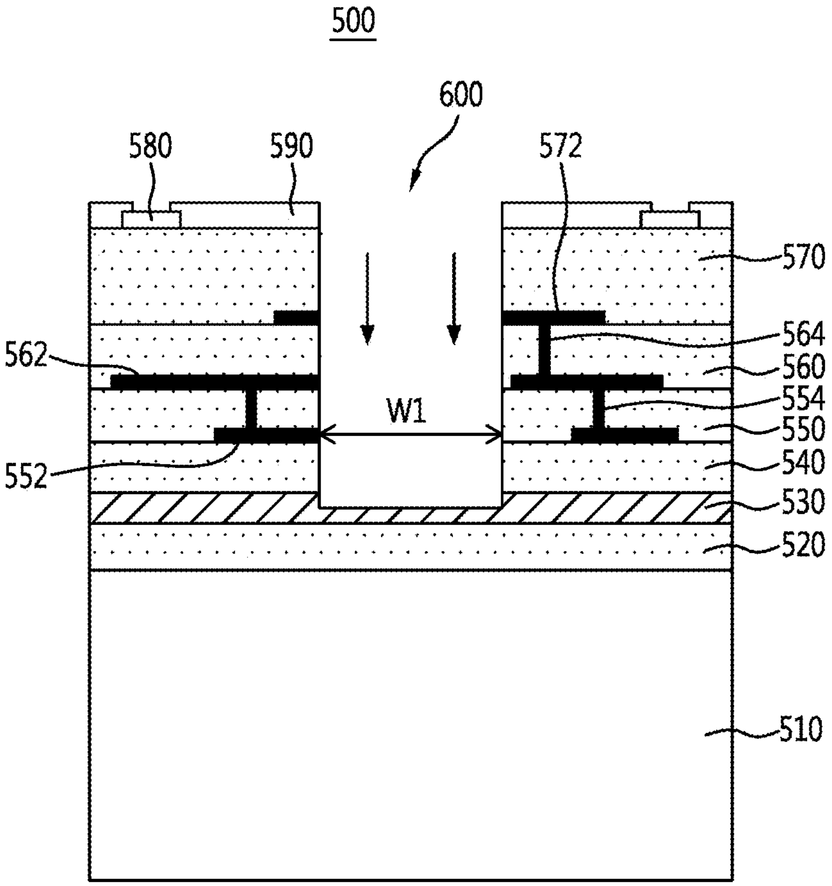

FIG. 2B shows a process of forming a frontside hole in a silicon wafer.

In the process of forming a frontside hole 600, also referred to herein as a frontside aperture 600, shown in FIG. 2B, a silicon nitride layer 530 having a selectivity ratio, serves as an etching stop layer, so the etching reaches the silicon nitride layer 530. Further, side surfaces of the metal wires 552, 562, 572 may be exposed after the first etching process. Referring to FIG. 2B, by the process of forming the frontside hole 600, a portion of the silicon nitride layer 530 is also etched, resulting in the formation of the frontside hole 600 with a first width w1. This process differs from etching up to the silicon wafer in the first example.

Figure 2C:
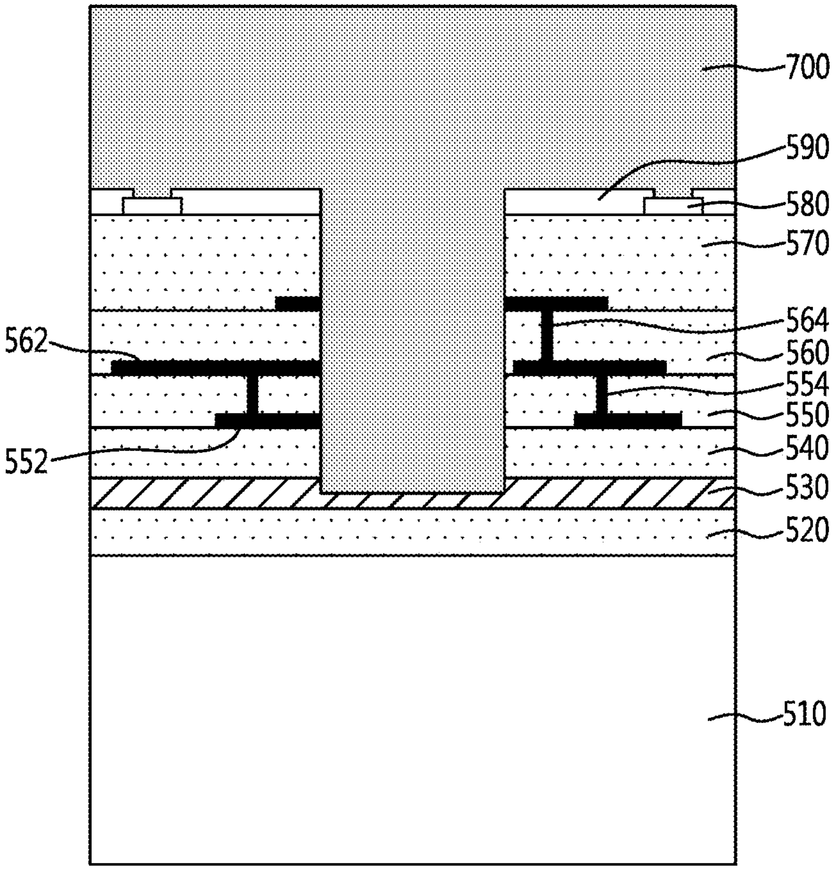

FIG. 2C shows a process for forming a protective layer 700 on a frontside hole of a silicon wafer 510 to fill the frontside hole 600. The protective layer 700 is provided to cover both the top surface of a passivation 590 and a pad 580 and the sides and bottom surface of the frontside hole 600. As mentioned in the first example, a protective layer is formed to prevent circuits or elements formed on the front side of the silicon wafer from being damaged, such as scratches. The protective layer comprises carbon-based materials such as photoresist (PR) or polyimide.

Figure 2D:
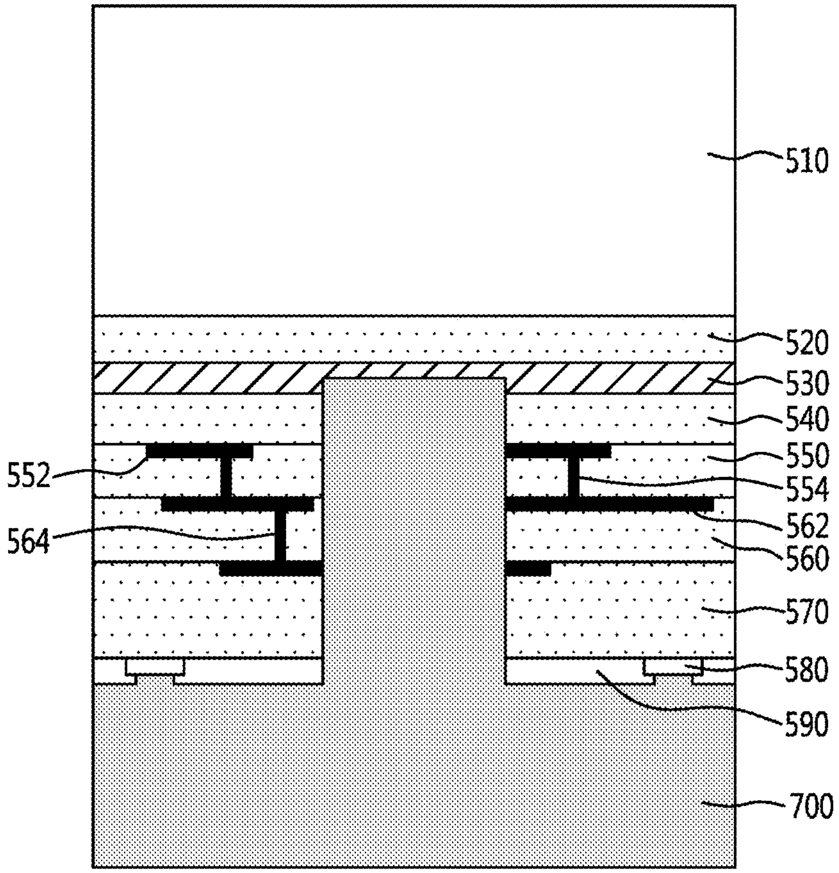

FIG. 2D shows the state where a silicon wafer 510 is turned over. When the silicon wafer 510 is turned over, referring to the drawing, a silicon wafer 510 from which a portion of the surface has been removed is located at the top. Below the silicon wafer 510 are a first silicon oxide layer 520, a silicon nitride layer 530, a second silicon oxide layer 540, a third silicon oxide layer 550, a fourth silicon oxide layer 560, a fifth silicon oxide layer 570, and a passivation 590 in this order. A protective layer 700 is located at the bottom.

Figure 2E:
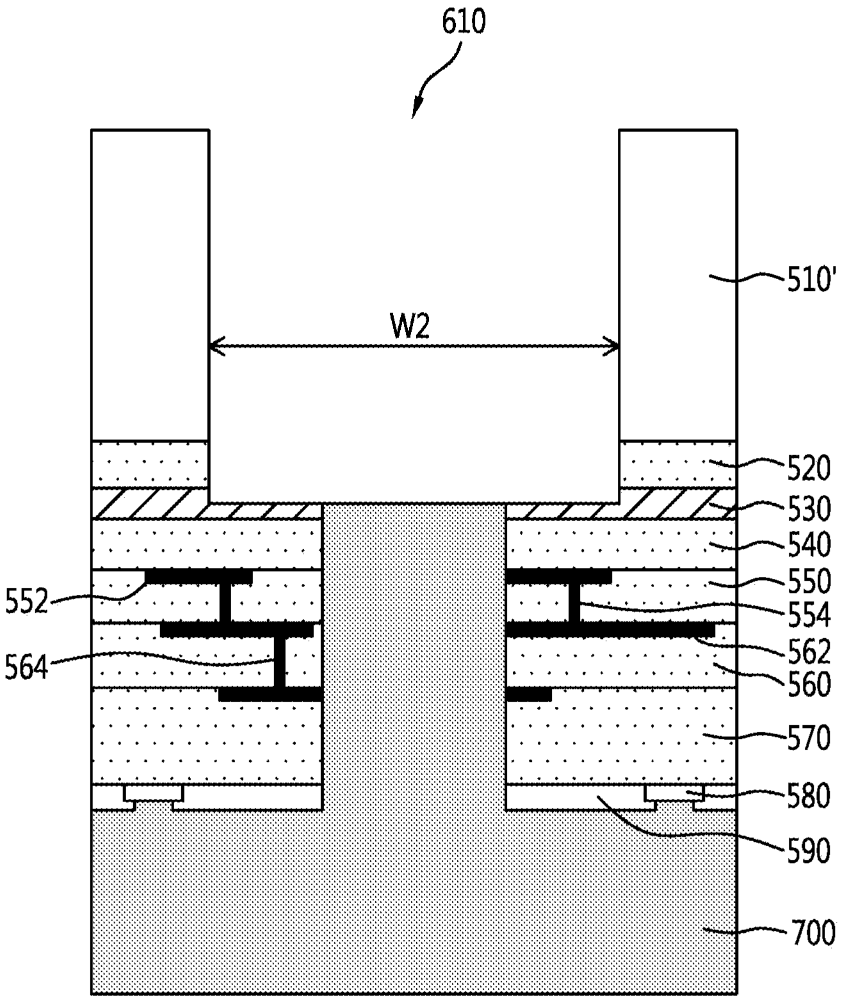

FIG. 2E shows a second etching process for forming a backside hole 610, also referred to herein as a backside aperture 610, in the back side of a silicon wafer 510.

The second etching process is a process for forming a backside hole 610 with a second width w2 greater than the first width w1, and it is a process of etching results in the removal of the silicon wafer 510 and a portion of the silicon nitride layer 520. Once the second etching process is complete, an ashing process and a cleaning process may be performed.

Once the second etching process in FIG. 2E is complete, the silicon wafer 510 is turned over again. The turned-over state is shown in FIG. 2F.

Figure 2F:
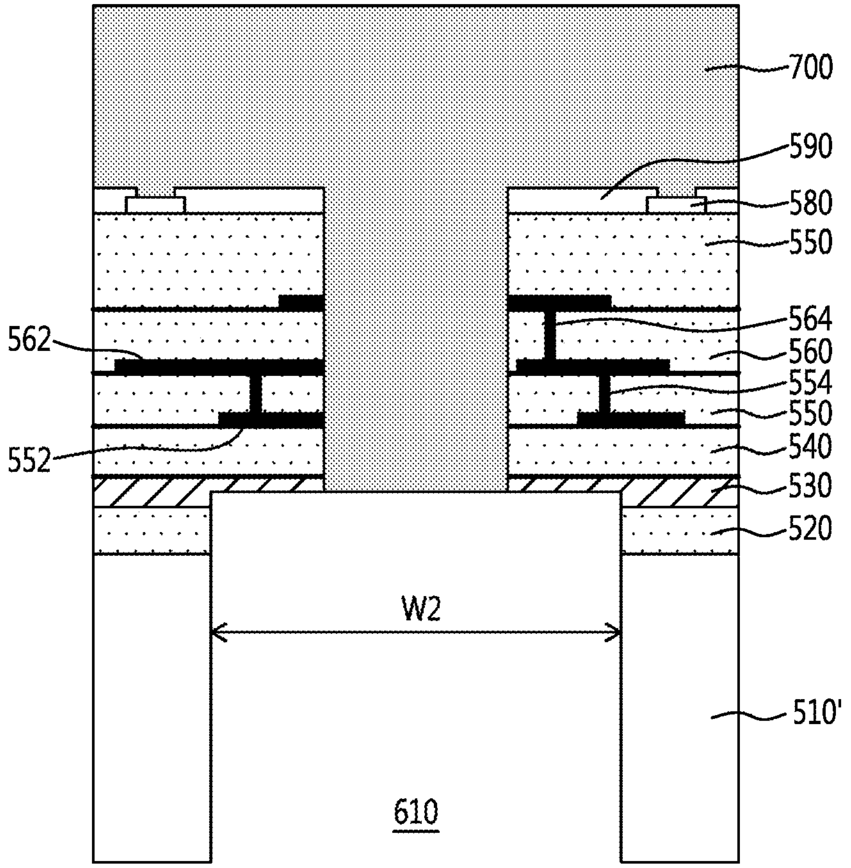

FIG. 2F shows the state where a backside hole 610 with a second width w2 is formed in a silicon wafer 510' and a protective layer 700 is formed in a frontside hole 600 with a first width w1. In that state, a protective layer removal process for removing the protective layer 700 is performed. The protective layer removal process is a process for removing the protective layer 700 made of photoresist (PR) or polyimide material, for example, by an $O_2$ ashing process. After the protective layer removal process, a cleaning process may be performed to remove foreign materials and other purposes.

Figure 2G:
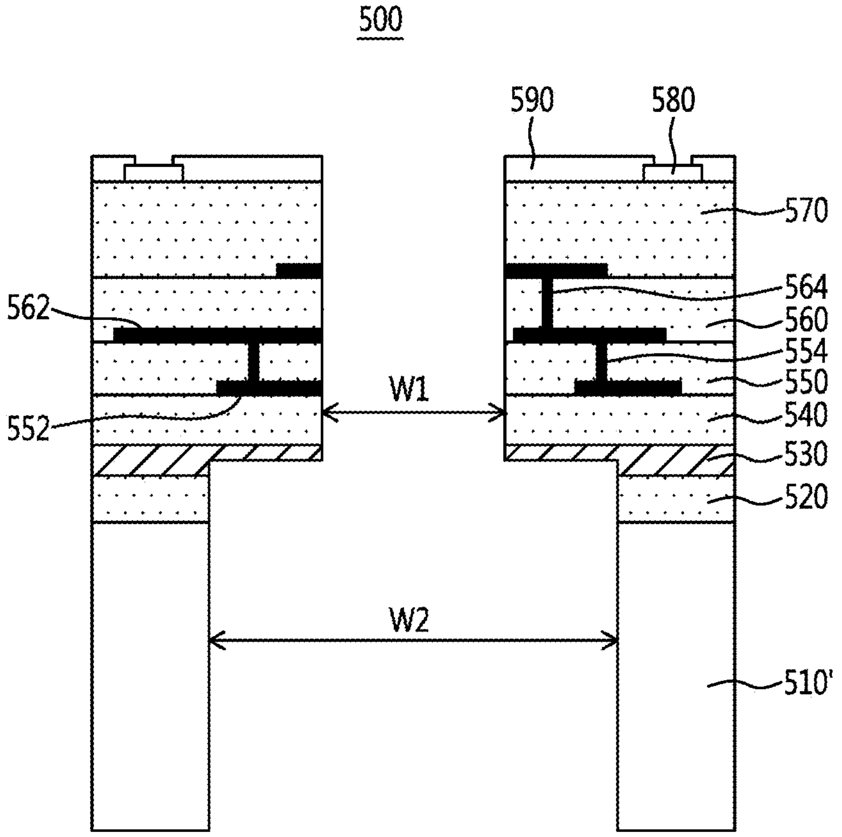

FIG. 2G shows a semiconductor device with a through structure in which the protective layer removal process has been performed. Once the protective layer 700 is removed, the semiconductor device obtains a structure where it is separated by through holes.

The present disclosure provides a method for manufacturing a semiconductor die for easily connecting the front and back sides of a semiconductor wafer.

The present disclosure provides a method for connecting a frontside hole and a backside hole of a semiconductor wafer while reducing the amount of etching to form the backside hole of the semiconductor wafer.

According to the present disclosure, the front side and the back side of a semiconductor wafer may be easily connected by a simple etching operation, thereby enabling the manufacture of devices with through structures to be performed more efficiently than in the past.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, in addition to the above and all drawing disclosures, the scope of the disclosure is defined not by the detailed description, but by the claims and their equivalents, and all variations within the scope of the claims and their equivalents are to be construed as being included in the disclosure.

What is claimed is:

1. A method for manufacturing a semiconductor die, comprising:

forming a front side of a semiconductor wafer by forming a first oxide layer, forming a nitride layer on the first oxide layer, and forming, on the nitride layer, at least one second oxide layer in which a metal wire is formed;

etching a surface of the semiconductor wafer to a predetermined depth to form a first aperture in the front side of the semiconductor wafer;

forming a protective layer on the front side of the semiconductor wafer and performing a first turning-over of the semiconductor wafer to a back side of the semiconductor wafer;

exposing a bottom of the first aperture to form a second aperture in the back side of the semiconductor wafer; and performing a second turning-over of the semiconductor wafer to the front side of the semiconductor wafer and removing the protective layer.

2. The method of claim 1, wherein, in the formation of the second aperture, the second aperture becomes connected to the first aperture once the protective layer is removed.

3. The method of claim 1, wherein the first oxide layer serves as an etching stop layer when forming the second aperture.

4. The method of claim 1, wherein the nitride layer is formed thinner than the first oxide layer.

5. The method of claim 1, wherein the protective layer is formed of photoresist (PR) or polyimide, a carbon-based material.

6. The method of claim 1, wherein a width of the first aperture is less than a width of the second aperture.

7. A method for manufacturing a semiconductor die, comprising:

forming a first oxide layer in a semiconductor wafer;

forming a nitride layer on the first oxide layer;

forming, on the nitride layer, at least one second oxide layer in which a metal wire is formed;

etching an upmost second oxide layer of the at least one second oxide layer to a predetermined depth to form a first aperture having a first width on a front side of the semiconductor wafer;

forming a protective layer on the first aperture;

etching a back side of the semiconductor wafer to form a second aperture, having a second width, connected to the first aperture; and removing the protective layer.

8. The method of claim 7, further comprising: turning over the semiconductor wafer when forming the first aperture and the second aperture.

9. The method of claim 7, wherein the second width of the second aperture is greater than the first width of the first aperture.

10. The method of claim 7, wherein the nitride layer is thinner than the first oxide layer.

11. A method for manufacturing a semiconductor die, comprising:

forming a first oxide layer, a silicon nitride layer, and a second oxide layer in a semiconductor wafer, wherein the second oxide layer comprises a contact plug and a metal wire;

etching the first oxide layer and the second oxide layer to form a first aperture having a first width;

forming a protective layer on the first aperture;

etching another side of the semiconductor wafer to form a second aperture, having a second width, connected to the first aperture; and removing the protective layer.

12. The method of claim 11, wherein the first oxide layer serves as an etching stop layer when forming the second aperture.

13. The method of claim 11, wherein the silicon nitride layer serves as an etching stop layer when forming the first aperture.

* * * * *